United States Patent
Kythakyapuzha et al.

(10) Patent No.: US 8,004,367 B2
(45) Date of Patent: Aug. 23, 2011

(54) VCO CONTROL AND METHODS THEREFOR

(75) Inventors: Shobak R. Kythakyapuzha, Round Rock, TX (US); Jason H. Branch, Round Rock, TX (US); Gary A. Kurtzman, Austin, TX (US); Haolu Xie, Palatine, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 50 days.

(21) Appl. No.: 12/428,215

(22) Filed: Apr. 22, 2009

(65) Prior Publication Data

US 2010/0271137 A1 Oct. 28, 2010

(51) Int. Cl.
*H03B 5/12* (2006.01)

(52) U.S. Cl. .......... 331/179; 331/16; 331/17; 331/36 C; 331/177 R (58) Field of Classification Search .......... 331/16, 331/17, 36 C, 179
See application file for complete search history.

(56) References Cited

U.S. PATENT DOCUMENTS

| | | | |
|---|---|---|---|
| 6,483,391 B1 * | 11/2002 | Magoon et al. | 331/183 |
| 6,496,075 B2 | 12/2002 | Justice et al. | |
| 6,512,419 B1 * | 1/2003 | Adams et al. | 331/17 |
| 6,545,545 B1 | 4/2003 | Fernandez-Texon | |
| 6,552,618 B2 | 4/2003 | Nelson et al. | |
| 6,566,966 B1 | 5/2003 | Bellaouar et al. | |
| 7,154,342 B2 * | 12/2006 | Munker et al. | 331/11 |
| 2006/0145767 A1 * | 7/2006 | Vaananen | 331/16 |

* cited by examiner

*Primary Examiner* — Joseph Chang
*Assistant Examiner* — Jeffrey Shin (57) ABSTRACT

A PLL receives an indicator indicating that it is to operate at a different operating frequency than a current operating frequency. A control word is selected from a set of linear control words based upon the different operating frequency. A capacitance of a variable capacitor of a voltage-controlled oscillator is adjusted based upon the control word. The variable capacitor is monotonic and non-linear relative to the set of linear control words.

16 Claims, 5 Drawing Sheets

VCO CONTROL AND METHODS THEREFOR

BACKGROUND

1. Field of the Disclosure

The present disclosure relates generally to electronic devices, and more particularly, to electronic devices having a voltage-controlled oscillator.

2. Description of the Related Art

Electronic devices can include oscillators to provide clock signals or other reference signals needed by the electronic device to perform its intended function. A crystal oscillator is often used to provide a signal at a fixed frequency. A phase-locked loop (PLL) can be utilized to provide a signal at an adjustable frequency. A PLL generally includes a voltage-controlled oscillator (VCO) that is calibrated by placing the PLL in an open-loop mode. The frequency of a signal provided by the PLL is adjusted by configuring a divisor implemented by the digital divider accordingly. The open-loop calibration process is repeated when the selected divisor requires a coarse change in the variable capacitance of a variable capacitor of the VCO.

The operating capabilities of a PLL are characterized using specifications including calibration time, lock time, lock range, tuning sensitivity (Kv), noise level, and other attributes. For example, the lock range and the calibration time of a PLL device indicate how quickly the PLL device can respond to a request to alter the frequency of a signal that is provided by the PLL. In particular, if the change in operating frequency exceeds the lock range, a calibration procedure may need to be performed. The correct operation of an electronic device may preclude excessive delays necessary to execute a calibration procedure. Unfortunately, attempts to increase the lock range of the PLL device by increasing its tuning sensitivity can be accompanied by a compromised noise level and greater manufacturing cost.

BRIEF DESCRIPTION OF THE DRAWINGS

The present disclosure may be better understood, and its numerous features and advantages made apparent to those skilled in the art by referencing the accompanying drawings.

DETAILED DESCRIPTION

An open-loop calibration procedure is performed during initialization of a VCO of a PLL. The frequency of oscillation of a VCO herein disclosed can subsequently be adjusted over a desired frequency range while the PLL remains in a closed-loop configuration, and without the need to execute an additional open-loop calibration procedure. The frequency of oscillation of the VCO can be subsequently adjusted throughout the desired frequency range by providing an appropriate control word from a set of linear control words. A variable capacitor of the VCO is monotonic and non-linear relative the set of linear control words, e.g., a linear variation between sequentially adjacent words of the set of linear control words provides a monotonic and non-linear variation in the capacitance of the variable capacitor. In one embodiment, the variable capacitor's non-linear characteristic relative to the set of linear control words is selected to provide a substantially linear variation in the frequency of oscillation of the VCO for variations of the control words.

Figure 1:
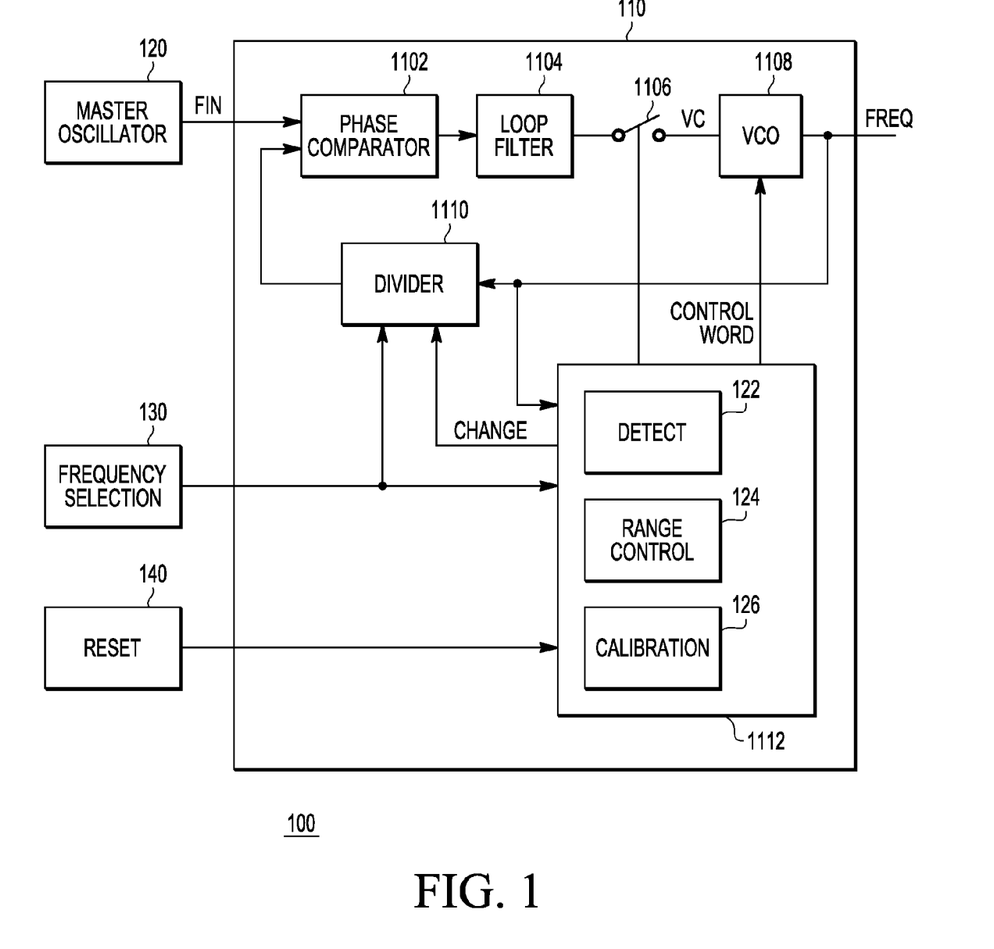
FIG. 1 is a block diagram illustrating a phase locked loop included at an electronic device in accordance with a specific embodiment of the present disclosure.

FIG. 1 is a block diagram illustrating a PLL 110 included at an electronic device 100 in accordance with a specific embodiment of the present disclosure. PLL 110 includes a phase comparator 1102, a loop filter 1104, a switch 1106, a VCO 1108, a divider 1110, and a control module 1112. Control module 1112 includes detect module 122, range control module 124, and calibration module 126. Electronic device 100 also includes a master oscillator 120, a frequency selection module 130, and a reset module 140. In an embodiment, electronic device 100 is in a mobile network device, such as a mobile telephone.

Master oscillator 120 has an output connected to phase comparator 1102 via a node labeled "FIN." Phase comparator 1102 has another input connected to the output of divider 1110, and an output connected to loop filter 1104. Loop filter 1104 has an output connected to a first terminal of switch 1106. Switch 1106 has a second terminal connected to a voltage-control input of VCO 110 via node labeled "VC," and a control input connected to an output of control module 1112. VCO 1108 has a control input connected to control module 1112 via a node labeled "CONTROL WORD", and an output connected to divider 1110 and control module 1112 via a node labeled "FREQ." Frequency selection module 130 is connected to divider 1110 and control module 1112. Reset module 140 is connected to control module 1112. Control module 1112 is connected to divider 1110 via a node labeled "CHANGE." It will be appreciated that for ease of discussion, the terms CONTROL WORD, FREQ, and VC are used to refer to corresponding nodes, as well as to the signals conducted via a respective node.

Master oscillator 120 is configured to provide a signal at a desired frequency to PLL 110. In an embodiment, master oscillator 120 is a crystal oscillator operating at a characteristic frequency. In another embodiment, master oscillator 120 can include another type device capable of providing a signal at a frequency, and may itself include a PLL.

PLL 110 includes a loop-circuit including phase comparator 1102, loop filter 1106, VCO 1108, and divider 1110. Phase comparator 1102 is configured to receive the signal provided by master oscillator 120 and a feedback signal provided by divider 1110, and to generate an error signal indicative of the phase difference between the two received signals. The error signal at the output of the phase comparator 1102 is integrated by loop filter 1104 to generate voltage that can be provided to VCO 1108. VCO is configured to provide signal FREQ that is determined based upon the voltage at node VC and by a numerical value, e.g., a digital value referred to as a control word, represented by a signal CONTROL WORD. The frequency of signal FREQ is divided by divider 1110 based upon an amount specified by frequency selection module 130 and the resulting signal is provided to phase comparator 1102, as previously described, and thus completing a feedback loop. During normal operating conditions, switch 1106 is closed and PLL 110 is said to be operating in a closed-loop configuration. During the execution of a calibration procedure, switch 1106 is opened, and PLL 110 is said to be operating in an open-loop configuration.

Frequency selection module 130 indicates the frequency of signal FREQ provided by PLL 1108 during the operation of electronic device 100. Information provided by frequency selection module 130 determines the divisor implemented by divider 1110 and the value of a control word provided by signal CONTROL WORD that is used by VCO 1108 to configure the capacitance of a tank capacitor included at VCO 1108.

Reset module 140 is configured to initiate the execution of a calibration procedure at PLL 110. In an embodiment, the calibration procedure is performed only once in response to a reset or power-on condition of electronic device 100, and is not repeated due to a change in operating frequency specified by frequency selection module 130. Frequency selection module 130 can identify a frequency at which PLL 110 is to provide signal FREQ that is suitable for the operation of electronic device 100. For example, electronic device 100 may be a mobile telephone, which can broadcast at a variety of frequencies corresponding to respective network cells or network channels. Frequency selection module 130 can manage communications protocols implemented by the cellular telephone and configure the operating frequency of PLL 110 accordingly.

Calibration module 126 at control module 1112 is configured to execute a calibration procedure at PLL 110, and to configure the oscillating frequency of PLL 110 during an open-loop operation. During the execution of a calibration procedure, calibration module 126 configures PLL 110 to operate in an open-loop mode by opening switch 1106. The electrical characteristics of components included at VCO 1108 can vary due to a normal manufacturing process, and the calibration procedure identifies a bias value to compensate for these variations. During calibration, range control module 124 provides control word values to VCO 1108 and monitors signal FREQ to determine a suitable calibration bias. Following execution of the calibration procedure, calibration module 126 configures PLL 110 to operate in a closed-loop mode by closing switch 1106, and the operating frequency of PLL 110, locks to the frequency specified by frequency selection module 130.

Frequency selection module 130 can adjust the frequency of operation of PLL 110 to a different frequency throughout a supported operating frequency range by providing an updated divisor to divider 1110 and control module 1112. In response to detect module 122 determining frequency selection module 130 is requesting a new frequency, range control module 124 determines a suitable control word to be provided to VCO 1108 via signal CONTROL WORD, and indicates to divider 1110 when to load the new divisor via signal CHANGE. Signal CONTROL WORD configures the capacitance of a coarse-range tank capacitor bank at VCO 1108 to provide coarse-range control of the frequency of signal FREQ, while a feedback control voltage received at the VCO via node VC provides fine-range control of the frequency of signal FREQ.

In according to one embodiment, the operating frequency of PLL 110 is linear with respect to the divisor as determined by the formula:

frequency(FREQ)=frequency(FIN)×value(Divisor)

wherein the frequency of signal FREQ provided by PLL 110 is determined by the frequency of signal FIN and the value of the divisor at divider 1110. Following the receipt of an updated desired operating frequency from frequency selection module 130, PLL 110 establishes a state of lock to the new frequency over a period of time referred to as the lock time. The time required for PLL 110 to transition from one frequency of operation to another frequency of operation occurs during closed-loop operation, and does not include additional open-loop operation time to perform another calibration procedure to set the coarse-range tank of the VCO. This provides for quicker locking time over PLL's that recalibrate the VCO while the PLL is in an open loop mode in response to a frequency change that requires the coarse capacitance of the tank capacitor to be changed. In one embodiment, the frequency range supported by PLL 110 without the need for another open-loop calibration procedure is greater than a delta of 100 Megahertz (MHz), 200 MHz, 400 MHz, or 600 MHz. For example, a frequency range that is from 3.4 to 4.4 Gigahertz (GHz) can be implemented, which has a difference between the minimum operating frequency (3.4 GHz) and a maximum operating frequency (4.4 GHz) of 1100 MHz. In another embodiment, the frequency range supported by PLL 110 is from 3.2 to 4.0 GHz. It will be appreciated that the techniques disclosed herein are applicable with regard to a greater or lesser range of operating frequencies, such as transmit and receive frequencies associated with the third generation telecommunication hardware standard (3G) and general technology associated with mobile networking.

Figure 2:
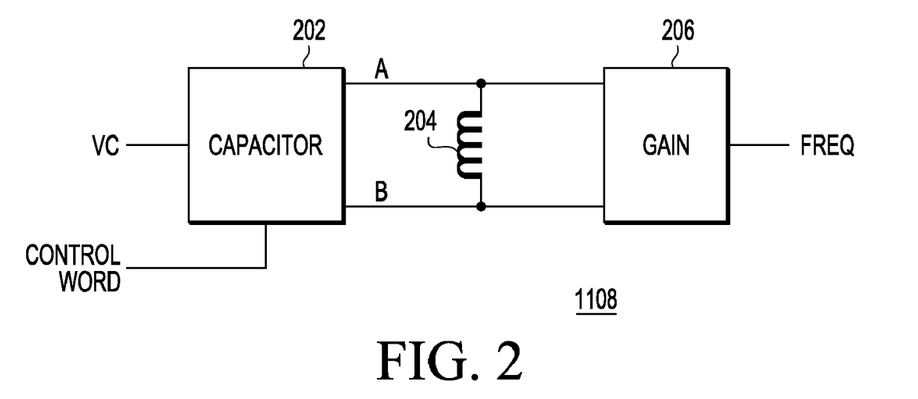
FIG. 2 is a block diagram illustrating the VCO of FIG. 1 in accordance with a specific embodiment of the present disclosure.

FIG. 2 is a block diagram illustrating VCO 1108 of FIG. 1 in accordance with a specific embodiment of the present disclosure. VCO 1108 includes a capacitor module 202, an inductor 204, and a gain module 206. Capacitor module 202 has an input connected to node VC, another input connected to node CONTROL WORD, a terminal connected to a first terminal of inductor 204 and to gain module 206 via a node labeled "A," and another terminal connected to a second terminal of inductor 204 and to gain module 206 via a node labeled "B." Capacitor module 202 and inductor 204 together form a tank circuit, which combined with gain module 206 form an oscillator, such as a Colpits, a Hartley, or another type of oscillator. Gain module 206 has an output connected to node FREQ. Signal CONTROL WORD configures the capacitance of capacitor module 202.

The frequency of oscillation of VCO 1108 is described by the equation:

$$\text{frequency}(FREQ) = \frac{1}{2\pi\sqrt{LC}}$$

where L represents the inductance of inductor 204 in Henrys, and C represents the capacitance of capacitor module 202 in Farads.

Figure 3:
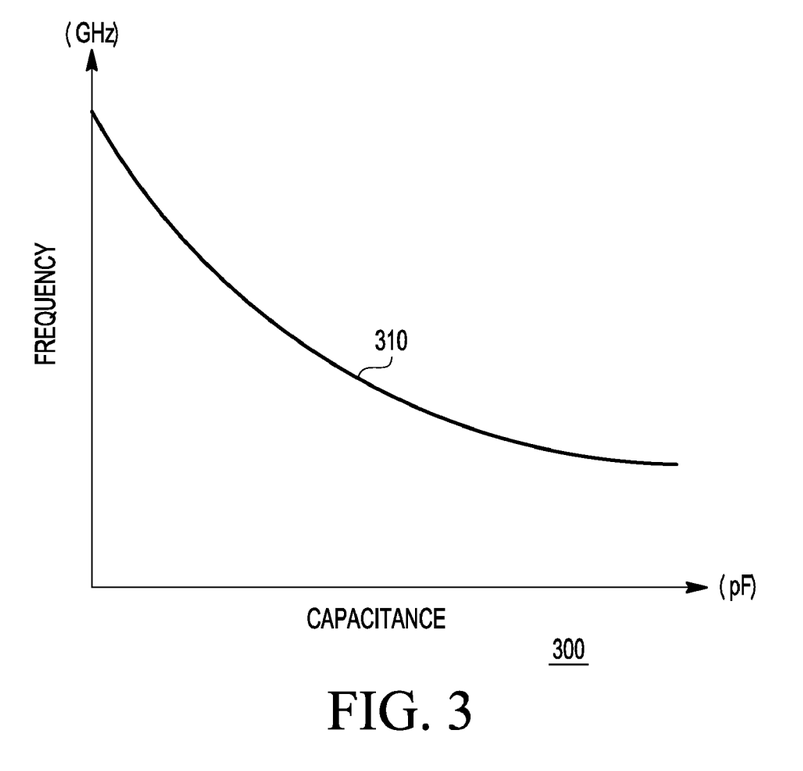
FIG. 3 is a graph illustrating the frequency of the VCO of FIG. 2 as a function of the capacitance of the capacitor module in accordance with a specific embodiment of the present disclosure.

FIG. 3 is a graph 300 illustrating the frequency of VCO 1108 of FIG. 2 as a function of the capacitance of capacitor module 202 of FIG. 2 in accordance with a specific embodiment of the present disclosure. Graph 300 has a horizontal axis representing capacitance in picoFarads (pF), and a vertical axis representing frequency in GigaHertz (GHz). Curve 310 represents the frequency of signal FREQ, and illustrates that the frequency of oscillation of VCO 1108 changes in a non-linear manner proportional to the reciprocal of the square-root of the capacitance of capacitor 202 of FIG. 2.

Figure 4:
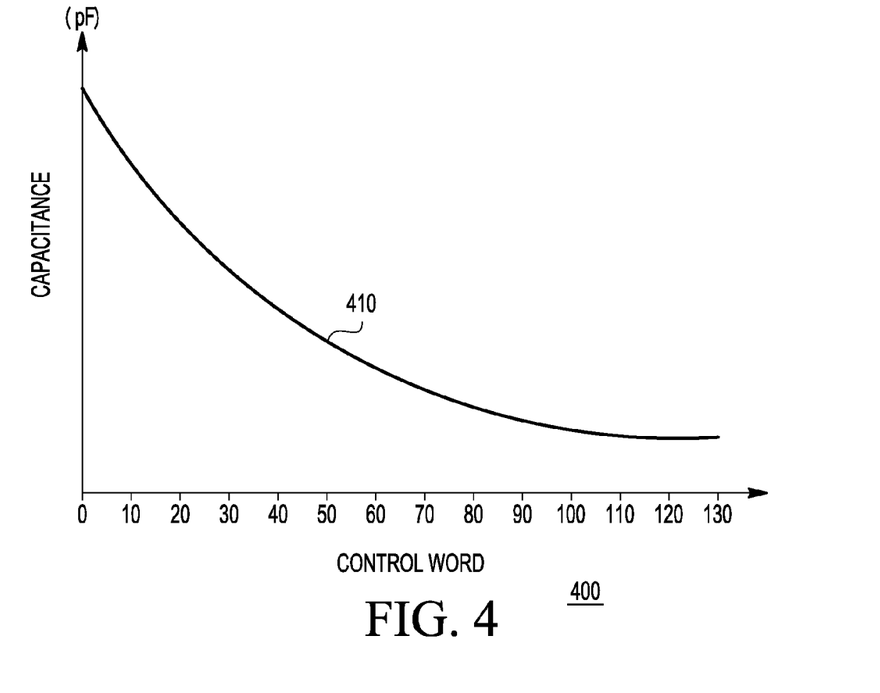
FIG. 4 is a graph illustrating the capacitance of the capacitor module of FIG. 2 as a function of a value represented by signal CONTROL WORD in accordance with a specific embodiment of the present disclosure.

FIG. 4 is a graph 400 illustrating the capacitance of capacitor module 202 of FIG. 2 as a function of a value represented by signal CONTROL WORD in accordance with a specific embodiment of the present disclosure. Graph 400 includes a horizontal axis representing the control words of the set of linear control words represented by signal CONTROL WORD, and a vertical axis representing the capacitance provided by capacitor module 202 in picoFarads. Curve 410 represents the capacitance provided by capacitor module 202. In an embodiment, signal CONTROL WORD represents a linear set of integer values ranging from zero to 127, where the set of linear control words is a set of sequentially adjacent values, whereby there is a common delta between adjacent values (control words) in the set. For example, the set of linear control words could be integers from 0-127, whereby the delta between adjacent control words is one. A control word from the set of linear control words can also be referred to as a digital tuning control value.

Figure 5:
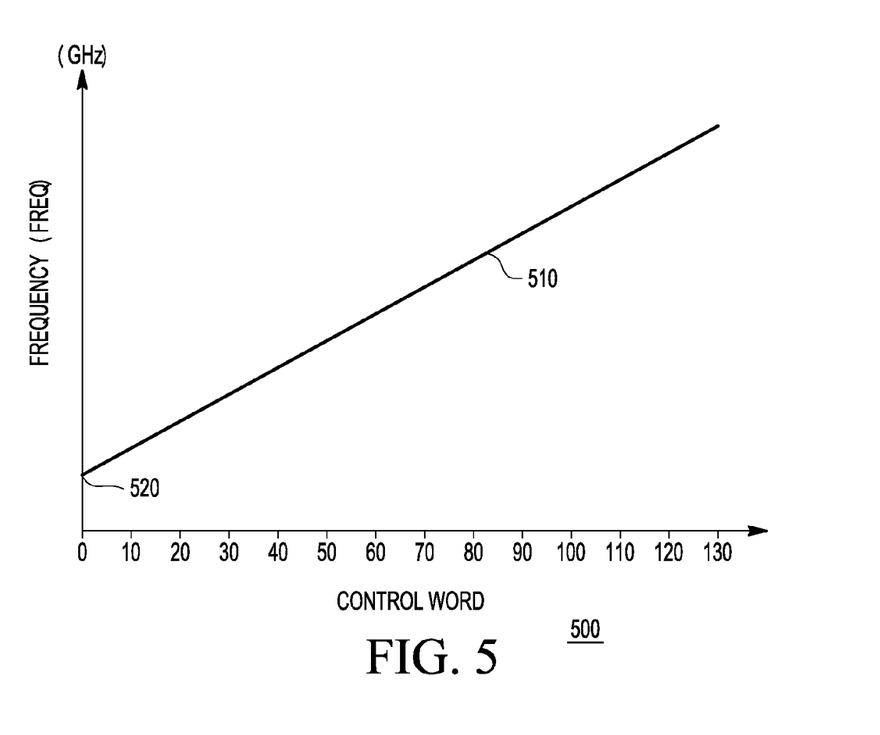
FIG. 5 is a graph illustrating the frequency of oscillation of the VCO of FIG. 2 as a function of the value represented by the signal CONTROL WORD in accordance with a specific embodiment of the present disclosure.

The digital tuning control value can be represented as a seven bit binary-encoded value. Because the frequency of oscillation of VCO 1108 is proportional to the reciprocal of the square-root of the tank capacitance, capacitor module 202 is configured to provide a capacitance that is proportional to the reciprocal of the square-root of the digital tuning control value provided by signal CONTROL WORD. Thus, a linear increase in the digital tuning control value provided by signal CONTROL WORD results in a non-linear change of the capacitance of capacitor 202 that corresponds to a linear increase in the frequency of oscillation of VCO 1108 as illustrated at FIG. 5. Therefore, an interpolation process can be used to determine a particular value of signal CONTROL WORD corresponding to a desired operating frequency. For example, a value of signal CONTROL WORD selected from the set of linear control words can be determined by a linear interpolation of the available range of control words that corresponds to the range of PLL operating frequencies by the following equation:

control word=[[frequency(DESIRED)−frequency(MIN)]/[frequency(MAX)−frequency(MIN)]]*[NumberOfControlWords−1];

where frequency(DESIRED)−frequency (MIN) is the difference between the desired operating frequency and the minimum operating frequency, frequency(MAX)−frequency (MIN) is the difference between the maximum operating frequency and the minimum operating frequency, and NumberOfControlWords is the total number of control words (128 for a seven bit control word).

FIG. 5 is a graph 500 illustrating the frequency of oscillation of VCO 1108 of FIG. 2 as a function of the value represented by the signal CONTROL WORD in accordance with a specific embodiment of the present disclosure. Graph 500 includes a horizontal axis representing the value represented by signal CONTROL WORD, and a vertical axis representing the frequency in Gigahertz of VCO 1108. Curve 510 represents the frequency of signal FREQ, and illustrates that the frequency of oscillation of VCO 1108 increases linearly as a function of a linear increase in the digital tuning control value provided by signal CONTROL WORD.

In the particular embodiment illustrated, the digital tuning control values provided by signal CONTROL WORD are integer values ranging from zero to 127, where zero is the smallest control work and 127 is the largest control word. A change from one integer value to an adjacent integer value is referred to as a control step, and results in a corresponding frequency step of signal FREQ. The capacitance provided by capacitor module 202 is configured so that the total range of frequencies provided by PLL 110 corresponds substantially to the complete range of digital tuning control values. For example, if the frequency range provided by PLL 110 is 3.0 to 4.5 GHz, capacitor module 202 is configured to provide a linear variation across this frequency range in response to a linear variation of digital tuning control values provided by signal CONTROL WORD, from zero to 127. Thus, a digital tuning control value of zero corresponds to an oscillator frequency of 3.0 GHz, a digital tuning control value of 127 corresponds to an oscillator frequency of about 4.5 GHz, and a control step therefore corresponds to approximately 11 MHz. In another embodiment, the range of digital tuning control values can correspond to a different oscillator frequency range. Furthermore, the digital tuning control value may include a smaller or larger range of integer values (control steps). For example, the digital tuning control value may range from zero to 512, which can be represented as a nine-bit binary-encoded value, and provide 512 corresponding frequency steps.

Figure 6:
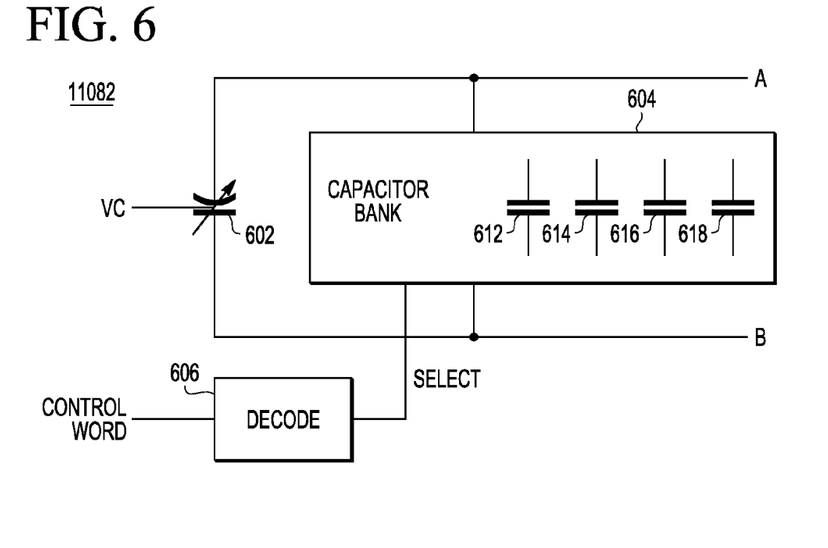
FIG. 6 is a block diagram illustrating the capacitor module of FIG. 2 in accordance with a specific embodiment of the present disclosure.

FIG. 6 is a block diagram illustrating capacitor module 202 of FIG. 2 in accordance with a specific embodiment of the present disclosure. Capacitor module 202 includes fine-control variable capacitor 602, a coarse-control capacitor bank 604, and a decode module 606. Variable capacitor 602 is a voltage controlled variable capacitor and has a first electrode connected to node A, a second electrode connected to node B, and a control electrode connected to node VC. Capacitor bank 604 is a variable capacitor and has a first capacitor electrode connected to node A, a second capacitor electrode connected to node B, and a control terminal connected to a node labeled "SELECT." Decode module 606 has an input connected to node CONTROL WORD, and an output connected to node SELECT.

Capacitor bank 604 includes a plurality of capacitors represented by capacitor 612, capacitor 614, capacitor 616, and capacitor 618, and is configured to provide specific discrete capacitance values corresponding to each control word specified by signal CONTROL WORD, which is associated with a desired frequency range. Decode module 606 can include a state machine, a lookup table, or another type of device that decodes the value specified by signal CONTROL WORD to provide signal SELECT. Signal SELECT specifies which capacitors of the plurality of capacitors at bank 604 are selected to provide a specific discrete capacitance for a specific value of signal CONTROL WORD. During operation, variable capacitor 602 is configured to provide continuous adjustment of the total capacitance provided by capacitor module 202 between each of the discrete steps provided by capacitor bank 604 in response to the voltage received at input VC. Therefore, the capacitance provided by variable capacitor 602 is determined by the voltage at node VC, which is a variable voltage when operating in closed-loop mode, and can be set to a desired fixed voltage when operating in open-loop mode. Thus the frequency of oscillation of VCO 1108 is determined by the sum of the capacitance provided by coarse-control capacitor bank 604 and variable capacitor 602.

In an embodiment, capacitor bank 604 is implemented as eight sub-banks of capacitors, wherein each sub-bank includes four digitally controlled individual capacitors. In one embodiment, all capacitors at capacitor bank 604 are connected in parallel and individual capacitors provide a capacitance that is smaller when selected than when not selected. In another embodiment, capacitors are selectively connected to be place in, or removed from, parallel with other capacitors to change the total capacitance. Therefore, zero to four capacitors of each bank are selected by a four-bit binary coded portion of signal CONTROL WORD. Thus, each sub-bank of capacitors can provide sixteen discrete capacitance values. For purposes of discussion, it is assumed that each capacitor at a bank is connected in parallel, and when selected its capacitance is reduced, thereby reducing the total capacitance of the bank. For example, when the value of signal CONTROL WORD is zero, all of the capacitors of each sub-bank of capacitor bank 604 are connected in parallel to provide a maximum capacitance since none of their individual capacitors are selected. This maximum capacitance corresponds to a minimum frequency of oscillation of VCO 1108. Successive selection of individual capacitors at the sub-banks of capacitor bank 604 results in an incremental decrease in the capacitance of capacitor bank 604. Sub-banks can be successively selected based on the signal CONTROL WORD using a thermometer-code technique, whereby the capacitors being selected are non-binary weighted as described below. For example, the capacitance provided by a particular capacitor sub-bank decreases in sixteen steps, at which point the capacitor bank is configured to provide its minimum capacitance. Once a capacitor bank is so configured, it remains selected as additional capacitors at other sub-banks are selected. Decode module 606 controls which capacitors are selected based on the value specified by signal CONTROL WORD.

In another embodiment, capacitor bank 604 can be implemented using nine binary-weighted capacitors that are selected using a nine-bit value binary-encoded at signal CONTROL WORD to adjust the total capacitance. A binary-weighted capacitor bank includes a plurality of capacitors of different values, the value of a respective capacitor proportional to a corresponding binary magnitude. For example, if capacitor 612 has a value of X pF, the value of capacitor 614 is 2X pF, the value of capacitor 616 is 4X pF, and the value of capacitor 618 is 8X pF. Decode module 606 can include a lookup table to determine an appropriate value from the available 512 binary-encoded values that best implement the non-linear curve illustrated at FIG. 4 for a desired oscillator frequency.

It will be appreciated that the capacitance of the variable capacitor 602 associated with a particular control word need only be within an acceptable tolerance, the tolerance determined by the tuning range supported by variable capacitor 602 and the step size associated with signal CONTROL WORD. For example, if the lock range of PLL 110 provided by variable capacitor 602 is 40 MHz, and the step size is 11 MHz, a frequency error due to a capacitance value provided by capacitor bank 604 of less than 10 MHz would be within an acceptable tolerance. Therefore, it will be appreciated that so long as the capacitance provided by capacitor bank 604 substantially provides a capacitance that is proportional to the reciprocal of the square-root of the control word, as illustrated at FIG. 4, operation of the PLL can be obtained for a desired operating range, such as 3.0 to 4.5 GHz using a tuning sensitivity (Kv) of VCO 1108 that is approximately 25-40 MHz/volt at a nominal control voltage of 0.7 volts provided at node VC and a variance at node VC that generally varies from by +/−0.7 volts from the nominal control voltage.

The disclosed devices and methods provide PLL 110 with the capability to tune to any frequency included in a specified operating range without the need to repeat an open-loop calibration procedure. The electrical characteristics of components included at PLL 110 can vary due to a normal manufacturing process. These variations can affect Y-intercept 520 of curve 510 at FIG. 5, but do not substantially affect the slope of curve 510. Thus, the calibration procedure that is performed during the initialization of electronic device 100 identifies an appropriate bias to compensate for these variations so that the smallest value provided by signal CONTROL WORD corresponds to the minimum frequency of a supported range of frequencies. The calibration bias determined during the calibration process can be implemented by decode module 606, whereby the decoded value provided at the output of decode module 606 adjusts for manufacturing process variations.

Figure 7:
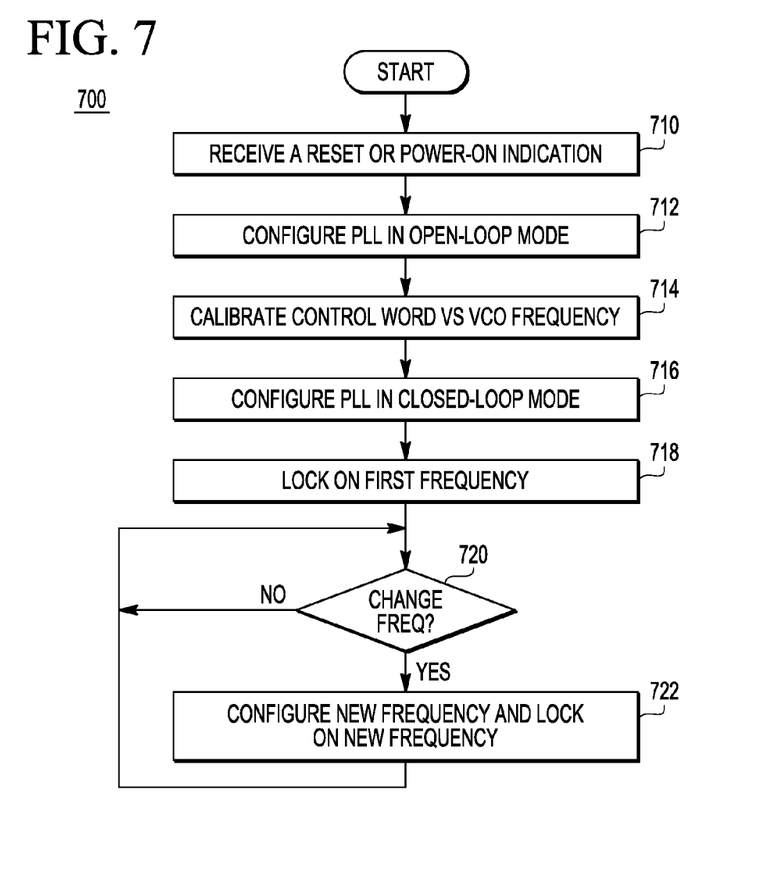
FIG. 7 is a flow diagram illustrating a method in accordance with a specific embodiment of the present disclosure.

FIG. 7 is a flow diagram illustrating a method 700 in accordance with a specific embodiment of the present disclosure. Method 700 illustrates the execution of a calibration procedure during the initialization of electronic device 100 and subsequent adjustments of the operating frequency of PLL 110. The flow begins at block 710 where a reset or power-on indication is received at control module 1112 of PLL 110 of FIG. 1. The flow proceeds to block 712 where PLL 110 is configured to operate in an open-loop mode by opening switch 1106. The flow proceeds to block 714 where PLL 110 is calibrated based on values represented by signal CONTROL WORD and the corresponding frequency of VCO 1108. The flow proceeds to block 716 where PLL 110 is configured to operate in a closed-loop mode by closing switch 1106. The flow proceeds to block 718 where PLL 110 locks to a selected frequency specified by frequency selection module 130. The flow proceeds to decision block 720 where it is determined whether a new operating frequency is desired. If frequency selection module 130 requests that PLL 110 operate at a different frequency, the flow proceeds to block 722 where control module 1112 provides a new control word to VCO 1108 if the different frequency corresponds to a different coarse capacitor, and provides a new divisor to divider 1110.

Figure 8:
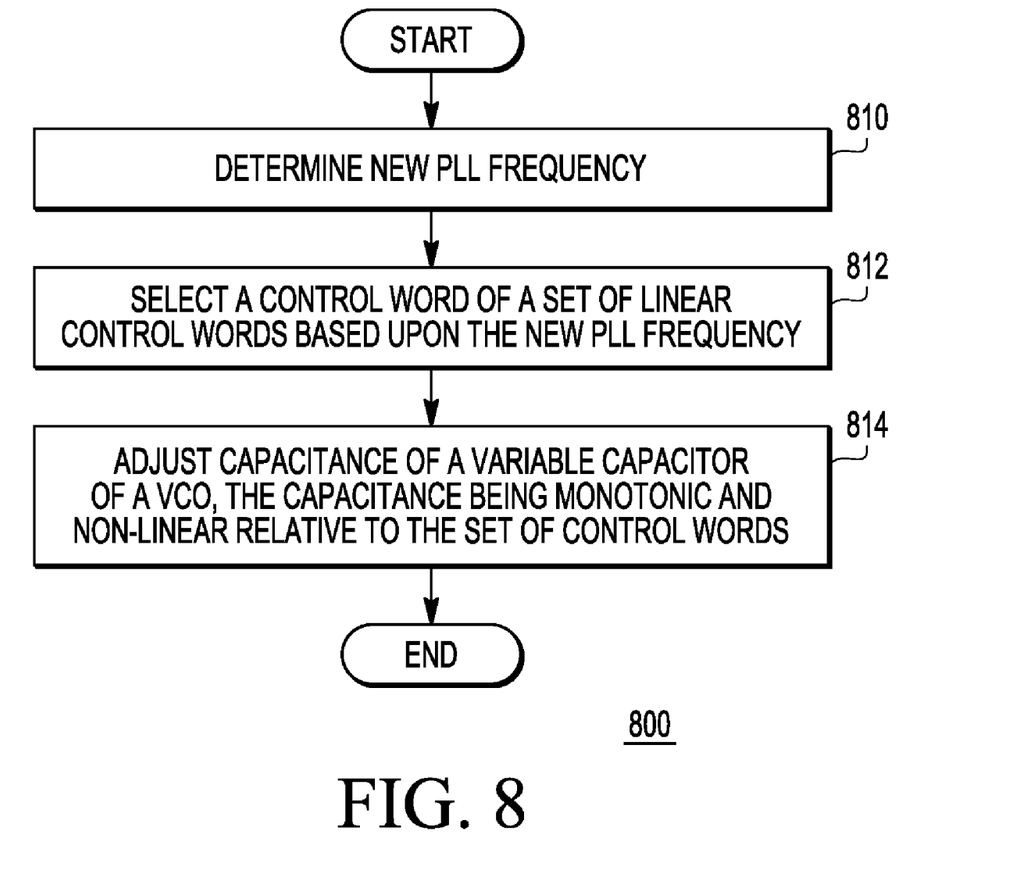
FIG. 8 is a flow diagram illustrating a method in accordance with a specific embodiment of the present disclosure.

FIG. 8 is a flow diagram illustrating a method 800 in accordance with a specific embodiment of the present disclosure. Method 800 illustrates the operation of VCO 1108 in response to a request to change the frequency of oscillation, such as at block 722 of FIG. 7. The flow begins at block 810 where it is determined that the frequency of operation at a PLL is to be updated from a current frequency to an updated frequency. For example, the detect module 122 of control module 1112 can receive a new PLL frequency, e.g., a new divisor from frequency selection module 130 and determine that the frequency is supposed to change by comparing the updated divisor to the previous divisor. The flow proceeds to block 812 where a new control word is selected from a set of linear control words based upon the updated PLL frequency. For example, the range control module 124 can select a new control word as previously described. The flow proceeds to block 814 where the coarse capacitance of a variable capacitor of a VCO_is adjusted, such as at bank 604, where the variable capacitor is monotonic and non-linear relative to the set of control words, in that increasing linear values of the control words result in the capacitance of the variable capacitor that is increasing and non-linear. Once the VCO is adjusted, control module 1112 can send a signal causing the divisor to be loaded into the divider 1110 if not loaded simultaneously with selection of the control word. Note that the PLL is maintained in a closed-loop configuration during the operations described at blocks 810, 812 and 814.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, switch 1106 at FIG. 1 is only illustrative of one way that PLL 110 can be configured to operate in a closed or open-loop mode. PLL 110 can also be configured to operate in an open-loop mode by disabling the effect of variable capacitor 602 of FIG. 6.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
Receiving an indicator that phase-locked loop (PLL) is to operate at a different operating frequency than a current operating frequency;
Selecting a first control word of a set of linear control words based upon the different operating frequency and based on a linear interpolation of the available range of control words that correspond to a linear range of PLL operating frequencies, wherein in the first control word is determinable by dividing the difference between the different operating frequency and a minimum operating frequency by the difference between a maximum operating frequency and the minimum operating frequency, and multiplying the result by the number of control words included in the set of linear control words; and
Adjusting a capacitance of a variable capacitor of a voltage controlled oscillator (VCO) based upon the first control word, the variable capacitor being monotonic and non-linear relative to the set of linear control words.

2. The method of claim 1 wherein
the set of linear control words facilitates operation of the PLL at a frequency range including a minimum operating frequency and a maximum operating frequency; and further comprising:
calibrating the operation of the VCO so that the minimum operating frequency of the VCO is achieved in response to selecting the smallest control word of the set of linear control words.

3. The method of claim 2 wherein
calibrating the operation of the VCO further comprises calibrating the operation of the VCO prior to operating at the current operating frequency and not recalibrating the VCO prior to operating at the different operating frequency.

4. The method of claim 3 wherein
calibrating the operation of the VCO further comprises calibrating the operation of the VCO while the PLL is operating in an open-loop configuration.

5. The method of claim 1 wherein a difference between the minimum operating frequency and the maximum operating frequency of the linear range of PLL operating frequencies is greater than 100 megahertz.

6. The method of claim 1 wherein
adjusting the capacitance of the variable capacitor of the VCO further comprises adjusting the capacitance of the variable capacitor of the VCO, while the PLL is maintained in a closed-loop configuration.

7. The method of claim 1 wherein
sequentially adjacent control words of the set of linear control words adjust the variable capacitor to provide a substantially equal change in the operating frequency of the PLL.

8. The method of claim 1 wherein
adjusting the capacitance of the variable capacitor of the VCO further comprises adjusting the capacitance by selecting capacitors at the variable capacitor from a plurality of capacitors that are not binary-weighted.

9. The method of claim 8 wherein the capacitors that are not binary weighted are selected from the plurality of capacitors to provide a total capacitance that is substantially proportional to the square root of the control words of the set of linear control words.

10. A device comprising:
A detect module operable to determine that a frequency of operation of a phase-locked loop (PLL) is to be updated;
A range control module coupled to the detect module to select a first control word of a set of linear control words based upon the updated frequency and based on a linear interpolation of the available range of control words that correspond to a linear range of PLL operating frequencies in response to determining the frequency of operation of the PLL is to be updated, wherein in the first control word is determinable by dividing the difference between the updated operating frequency and a minimum operating frequency by the difference between a maximum operating frequency and the minimum operating frequency, and multiplying the result by the number of control words included in the set of linear control words;
A voltage controlled oscillator (VCO) coupled to the range control module to receive the first control word, the VCO comprising a variable capacitor that is monotonic and non-linear relative to the set of linear control words;
A divider coupled to receive a first signal from the VCO and to provide a second signal at a frequency that is a fraction of the frequency of the first signal;
A phase comparator coupled to the divider to provide a detection signal indicative of a phase relationship between the second signal and an input signal;
A loop filter coupled to the phase comparator to provide a control signal to the VCO; and
A switch coupled to the filter and to the VCO to place the PLL in closed-loop mode when closed, and to place the PLL in an open-loop mode when opened, wherein the switch is further configured to place the PLL in the open-loop mode during a calibration operation.

11. The device of claim 10 further comprising:
a calibration module to calibrate the operation of the VCO so that the minimum operating frequency of the VCO is achieved in response to selecting a smallest control word of the set of linear control words.

12. The device of claim 10 wherein the variable capacitor comprises a capacitor bank and a decode module, the decode module operable to select a capacitance of the capacitor bank based upon the first control word.

13. The device of claim 10 wherein
the VCO is to update its capacitance based upon the first control word being selected while the PLL operates in a closed-loop mode.

14. The device of claim 10 wherein the variable capacitor includes a plurality of binary-weighted capacitors.

15. A phase-locked loop comprising:

A voltage controlled oscillator (VCO) comprising a variable capacitor and a control module, the variable capacitor comprising a plurality of capacitors, and a control module operable to receive a first control word of a set of linear control words, the first control word to select a combination of the plurality of capacitors at the variable capacitor to provide a total capacitance at the variable capacitor that is proportional to the square-root of the first control word, wherein in the first control word corresponding to a desired VCO frequency is selected based on a linear interpolation of the available range of control words that correspond to a linear range of the VCO frequencies, and wherein the first control word is determinable by dividing the difference between the desired operating frequency and a minimum operating frequency by the difference between a maximum operating frequency and the minimum operating frequency, and multiplying the result by the number of control words included in the set of linear control words.

16. The VCO of claim 15 wherein the control module is further operable to receive the control word and select the combination of the plurality of capacitors while the phase-locked loop is operating in a closed-loop mode.

* * * * *